(12) United States Patent
Solal et al.

(10) Patent No.: US 8,031,034 B1
(45) Date of Patent: Oct. 4, 2011

(54) SURFACE ACOUSTIC WAVE FILTER AND METHOD FOR IMPROVED REJECTION

(75) Inventors: Marc Solal, Longwood, FL (US); Pierre Alexandre Girard, Apopka, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 0 days.

(21) Appl. No.: 12/874,409

(22) Filed: Sep. 2, 2010

Related U.S. Application Data

(62) Division of application No. 11/845,300, filed on Aug. 27, 2007, now abandoned.

(51) Int. Cl.
*H03H 9/64* (2006.01)

(52) U.S. Cl. .......................................... 333/193; 333/195

(58) Field of Classification Search .......... 333/193–196; 310/313 R–313 D
See application file for complete search history.

(56) References Cited

U.S. PATENT DOCUMENTS

| | | | |
|---|---|---|---|
| 5,459,368 A | 10/1995 | Onishi et al. | |
| 5,508,667 A | 4/1996 | Kondratiev et al. | |
| 5,790,000 A * | 8/1998 | Dai et al. | 333/193 |
| 5,854,579 A | 12/1998 | Penunuri | |
| 6,833,774 B2 | 12/2004 | Abbott et al. | |
| 7,030,716 B2 | 4/2006 | Tsutsumi et al. | |
| 7,038,551 B2 | 5/2006 | Kearns | |
| 7,105,980 B2 | 9/2006 | Abbott et al. | |
| 7,196,594 B2 | 3/2007 | Cheema et al. | |
| 7,213,314 B2 | 5/2007 | Abbott et al. | |
| 7,358,832 B2 * | 4/2008 | Takamine | 333/193 |
| 7,425,879 B2 | 9/2008 | Taniguchi | |
| 7,579,928 B2 | 8/2009 | Otsuka et al. | |
| 7,728,698 B2 | 6/2010 | Bauer | |
| 2002/0158707 A1 | 10/2002 | Noguchi | |
| 2003/0227357 A1 | 12/2003 | Metzger et al. | |
| 2004/0196119 A1 | 10/2004 | Shibahara et al. | |
| 2007/0030096 A1 | 2/2007 | Nishihara et al. | |

OTHER PUBLICATIONS

Sola, M., Girard, M., Aguirre, A., Bayram, C., Carpenter, F., Sinnesbichler, K., Cheema, K., Malocha, S., Abbott, B., ; "Some Recent Advances in SAW Duplexers, and PA Duplexers Modules,"; Third International Symposium on Acoustic Wave Devices for Future Mobile Communication Systems,; Mar. 8, 2007.

* cited by examiner

*Primary Examiner* — Robert Pascal
*Assistant Examiner* — Alan Wong
(74) *Attorney, Agent, or Firm* — Allen, Dyer, Doppelt, Milbrath & Gilchrist, P.A.

(57) ABSTRACT

A SAW coupled resonator filter providing improved rejection outside the passband frequencies includes at least two filter tracks on a piezoelectric substrate with each track having a plurality of acoustically cascaded transducers disposed along a longitudinal axis of the filter track. At least one filter track includes signal pads driven in a differential mode or a balanced mode. The two tracks are electrically connected with crossover bridges crossing over connecting lines between the tracks such that voltages across the crossover bridges are approximately the same in magnitude but substantially out-of-phase. The connecting lines extend between opposing bus bars of split transducers within each of the filter tracks.

20 Claims, 12 Drawing Sheets

SURFACE ACOUSTIC WAVE FILTER AND METHOD FOR IMPROVED REJECTION

CROSS-REFERENCE TO RELATED APPLICATIONS

This application is a divisional of U.S. application Ser. No. 11/845,300, filed Aug. 27, 2007, the disclosure of which is hereby incorporated by reference herein in its entirety and commonly owned.

FIELD OF THE INVENTION

The present invention generally relates to surface acoustic wave (SAW) devices, and more particularly to a coupled resonator filters.

BACKGROUND OF THE INVENTION

Low noise amplifiers used in modern communications systems such as mobile phones often need to be driven in balanced or differential mode. In other words, they need to be fed by two input potentials with the same amplitude and with a 180 degrees phase difference. Usually, to protect the receiver against interferences, a filter is placed after the antenna. It is very common that the same antenna is used for both the transmitter and the receiver. In this case, depending on the communication system, the separation between the transmit path and the receive path is done with a switch (when they occur at different times) or with a duplexer that permits a frequency separation of a signal, as described by way of example with reference to U.S. Pat. No. 7,196,594 to Cheema et al. for a SAW Duplexer Having Enhanced Isolation Performance, the disclosure of which is herein incorporated by reference in its entirety. In both cases, it is advantageous to have a receive filter or a duplexer with a balanced output signal.

As is well known in the art, one very efficient technology useful in making RF filters or duplexers includes surface acoustic wave (SAW) devices. SAW ladder filters and resonator filters are two common design approaches to realize SAW RF filters and duplexers, as described by way of example with reference to U.S. Pat. No. 6,833,774 to Abbott et al. for a SAW Filter and U.S. Pat. No. 7,105,980 to Abbott et al. for a SAW Filter Device and Method Employing Normal Temperature Bonding for Producing Desirable Filter Production and Performance Characteristics, the disclosures of which are herein incorporated by reference in their entirety. The SAW ladder filter typically comprises series and shunt resonators electrically cascaded in a ladder network to form the filter. Each resonator consists of transducer placed between two reflective gratings. This structure achieves low losses and handles sufficient power. It is used in most SAW duplexers. The SAW ladder filter however cannot be used in a balanced or differential mode.

Yet further, and with regard to devices known in the art, problems result with crosstalk due to crossover capacitance between an output and lateral transducer connections. This crosstalk results in filter rejection degradation and in degradation of the symmetry. In spite of the extensive efforts made in the art, there remains a need to provide a filter with desirable rejection (attenuation outside a passband) and symmetry while providing low output impedance.

SUMMARY OF THE INVENTION

The present invention is directed to improving rejection within SAW filters. One embodiment of the invention is directed to a SAW coupled resonator filter that may comprise a piezoelectric substrate suitable for propagation of surface acoustic waves, at least two filter tracks, each track having a plurality of acoustically cascaded transducers disposed upon the piezoelectric substrate along a longitudinal axis of the filter track, wherein each of the filter tracks having a plurality of signal pads associated with the transducers and at least one of the filter track signal pads driven in at least one of a differential mode and a balanced mode, wherein the at least two tracks are electrically connected by at least two connecting lines, and a minimum of two crossover bridges crossing over the connecting lines such that voltages across the two crossover bridges are approximately the same in magnitude but are substantially out-of-phase.

Alternatively, a surface acoustic wave filter may comprise a piezoelectric substrate, at least two filter tracks, each track having a plurality of acoustically cascaded transducers disposed upon the piezoelectric substrate, wherein at least one of the filter tracks is driven in at least one of a differential mode and a balanced mode, a plurality of connecting lines electrically connecting the at least two filter tracks, and a plurality of crossover bridges crossing over at least two of the plurality of connecting lines such that voltages across the plurality of crossover bridges are approximately the same in magnitude but are substantially out-of-phase. Yet further, each track may comprise three transducers and two reflector gratings, wherein the reflector gratings are carried on each side of the transducers along the longitudinal axis. A signal input may be obtained at a center transducer along a first filter track and driven in a single ended mode, and a signal output may be obtained at a center transducer of a second filter track and driven in the at least one of the differential mode and the balanced mode. The connecting lines may be electrically coupled along external lateral transducers.

Further, transducers within each of the filter tracks may include split transducers, with connecting lines connecting the split transducers. By way of example, one surface acoustic wave coupled resonator filter may comprise a piezoelectric substrate having opposing filter tracks each including a plurality of acoustically cascaded transducers disposed upon the piezoelectric substrate along a longitudinal axis of the filter track. The plurality of acoustically cascaded transducers may include a center transducer and external transducers on opposing sides thereof, wherein the center transducer comprises a split transducer. Each of the filter tracks may have a plurality of signal pads associated with the transducers and at least one of the filter track signal pads is driven in at least one of a differential mode and a balanced mode, wherein the opposing filter tracks are electrically connected by at least two connecting lines connected between the opposing split transducers. At least two crossover bridges are provided with each crossover bridge crossing one of the at least two connecting lines such that voltages across the at least two crossover bridges are approximately the same in magnitude but are substantially out-of-phase. A signal input may be obtained at the external transducers along a first filter track and driven in a single ended mode, and a signal output obtained at the external transducers of a second filter track and driven in the at least one of the differential mode and the balanced mode. The signal input or the signal output is provided by an electrical connection including the crossover bridges.

Yet further, ground connecting lines may connect transducers to ground, wherein the crossover bridges cross over the ground connecting lines.

BRIEF DESCRIPTION OF THE DRAWINGS

For a fuller understanding of the invention, reference is made to the following detailed description, taken in connection with the accompanying drawings illustrating various embodiments of the present invention, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
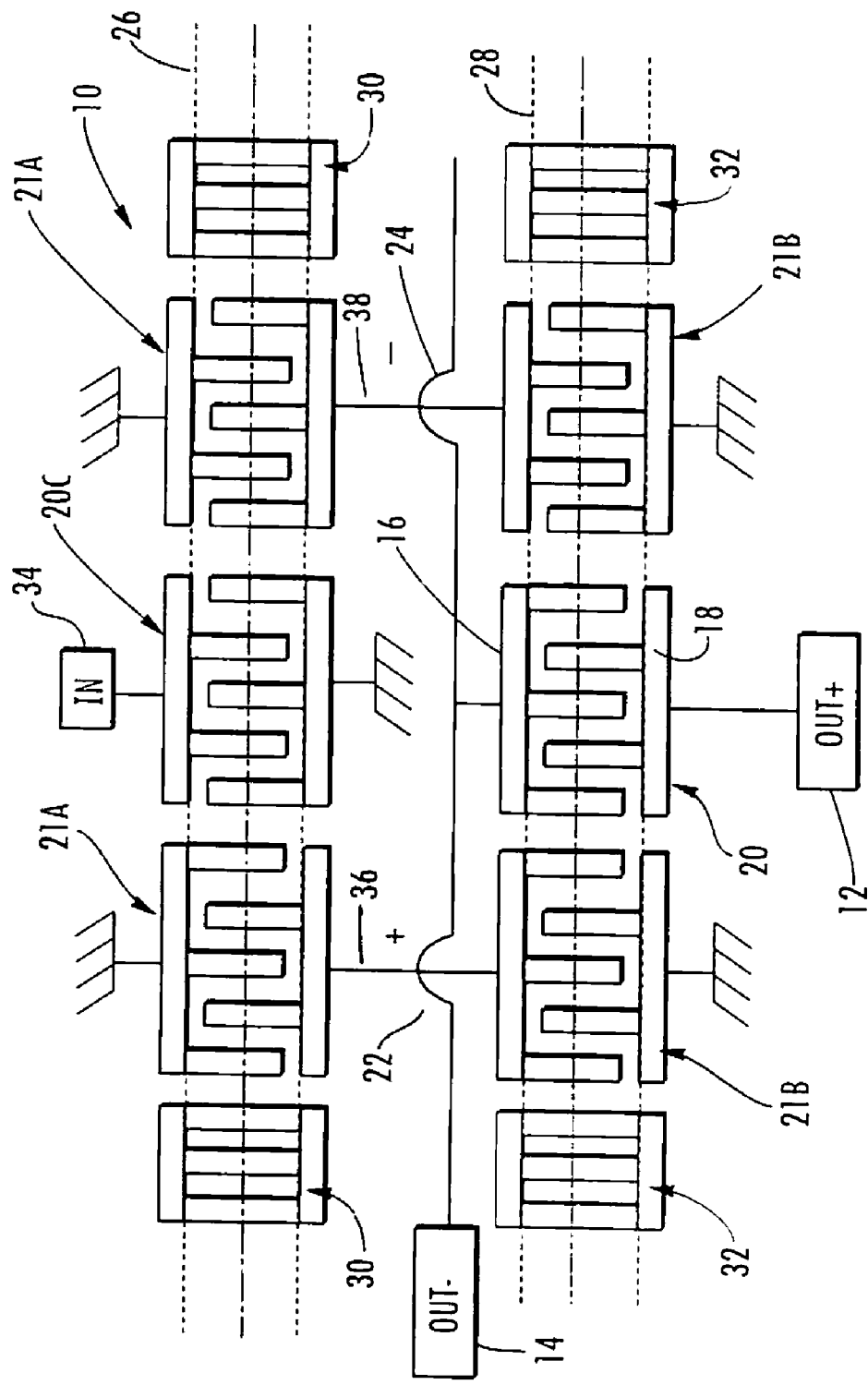
FIG. 1 is a diagrammatical illustration of one embodiment of a coupled resonator filter (CRF) in keeping with the teachings of the present invention.

As illustrated initially with reference to FIG. 1, one coupled resonator filter 10 is presented in keeping with the teachings of the present invention, wherein the coupled resonator filter (CRF) 10 has a balanced output (Out+, Out−) 12, 14 and low impedance. The signal output is derived from the signal pads, herein illustrated as bus bars 16, 18 of the same SAW transducer 20. As earlier presented and as will be further expanded upon for clarification, one problem in the art includes crossover parasitics resulting in electromagnetic coupling degrading the performance of the filter rejection and its phase and amplitude. One embodiment of the invention includes a crossover bridge 22 and an additional crossover bridge 24 crossing two crossover lines such that the voltages on these lines have substantially the same magnitude and are opposite in phase to cancel the effect of the electromagnetic parasitic coupling. The SAW filter 10 herein initially described, by way of example, includes two tracks 26, 28 with each having three transducers (center transducers 20, 20C and external transducers 21A, 21B) acoustically cascaded along a longitudinal axis forming the filter track 26, 28. Each of two filter tracks 26, 28 includes a reflective grating 30, 32 on each end. In this one embodiment herein described by way of example, a signal input 34 is obtained at the center transducer 20C along the first filter track 26 and is driven in a single ended mode while the signal output 12, 14 is obtained at the center transducer 20 along the second filter track 28 and is driven in a differential or balanced mode. The two tracks 26, 28 are electrically coupled along the external lateral transducers 21A, 21B by two connecting lines 36, 38 joining the lateral transducers. The filter 10 is such that signals received at each of the lateral transducers 21A, 21B within each track are 180 degrees out of phase. This may be done by changing the polarity of one of the external transducer in each track or by using an even number of periods in the center transducers 20, 20C. The two electrical connecting lines 36, 38 connecting the two tracks 26, 28 are thus now out of phase.

Figure 2:
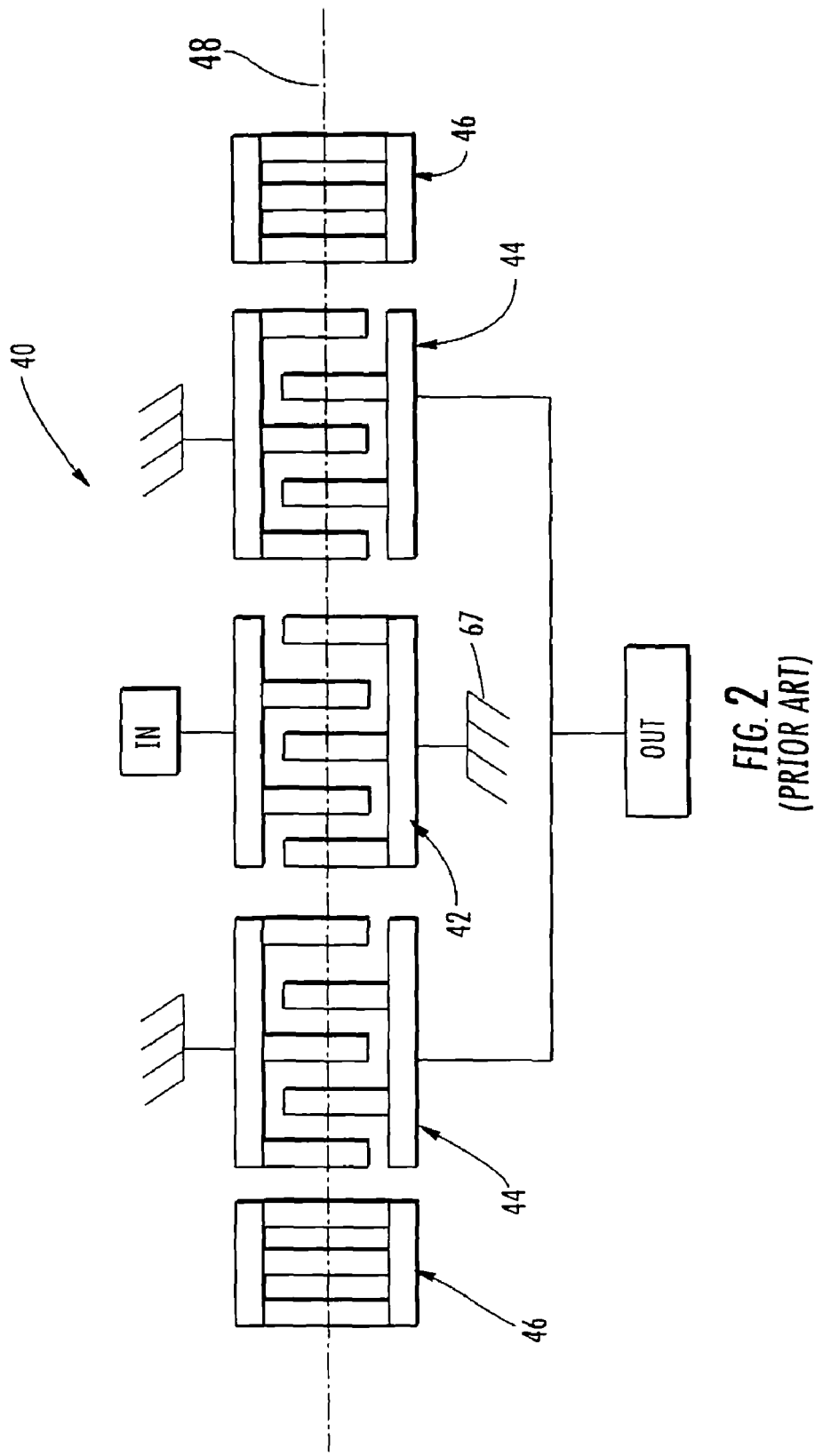
FIG. 2 is a diagrammatical plan view illustration of one known coupled resonator filter (CRF) having a single track.

By way of example with regard to a supporting technical description, consider one known coupled resonator filter 40 as illustrated with reference to FIG. 2. The coupled resonator filter (CRF) 40 comprises a plurality of transducers including an internal transducer 42 positioned between external transducers 44 placed between two reflective gratings 46 along a longitudinal axis 48, wherein the three transducers are placed in a cavity with the two external transducers connected in parallel. For this case, only the resonance modes symmetric in the longitudinal direction are excited. This filter typically uses two first symmetric longitudinal modes. Typically, the grating frequencies are different from the transducer frequencies and a gap 43 can be inserted between the transducers 42, 44 to create the cavities. Chirped sections in the transducer can alternatively replace the gap. In general, each transducer or grating will not be periodic but will have a period and electrode widths varying continuously or not along its length and gaps may be inserted between the different transducers and gratings. For simplicity, the transducers are represented as unapodized, (i.e. a succession of electrodes connected to the opposite bus bars). In general, the succession of electrode polarities may be different and include two electrodes in front of each other and each one connected to one of the bus bars may replace the electrode herein illustrated. This is referred to as apodization or aperture weigthing. The same applies to the gratings. They are represented as composed of electrodes of equal length, but apodization can be applied to the gratings meaning that the reflective electrodes may have a different aperture than the transducer aperture, and this aperture can be different from one electrode to the others.

For simplicity of the description, surface acoustic wave (SAW) devices are herein described by way of example but the invention applies to any filter using propagation of guided elastic waves. It applies for example if the elastic waves are Rayleigh waves or so called Leaky SAW or Pseudo SAW or Surface Transverse Waves. It will apply also when the wave propagates at the boundary of two materials for so called "boundary waves devices" or is guided inside a layered material placed at the surface of a substrate or between two materials. In addition, SAW devices are reciprocal devices in that the input and output of a device can be interchanged without modifying their behavior. The description remains valid when exchanging the inputs and outputs of the device.

Figure 3:
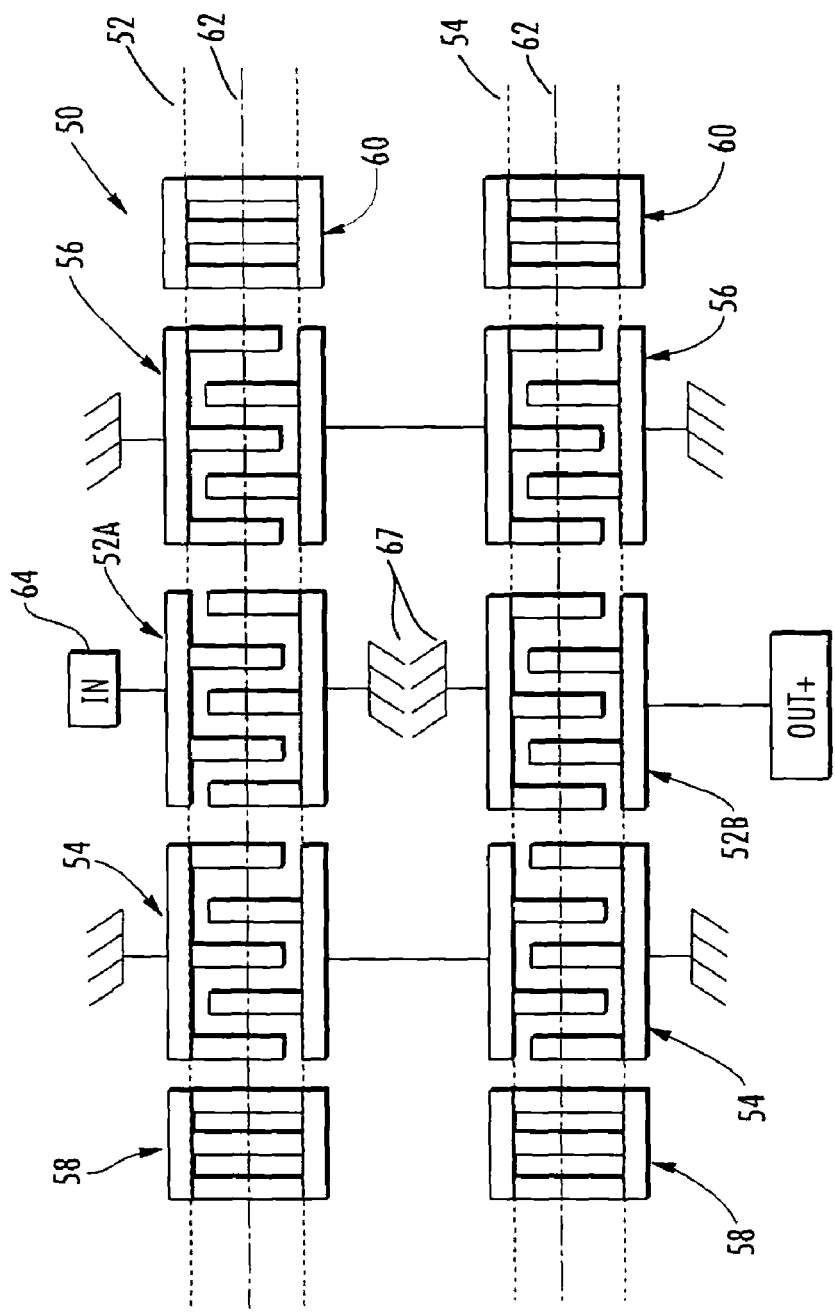
FIG. 3 is a diagrammatical plan view illustration of one known coupled resonator filter (CRF) having a two tracks.

The structure of FIG. 2 may provide a desired rejection to fulfill certain needs, but several stages may have to be cascaded, as illustrated with reference to FIG. 3. This filter 50 includes two tracks 52, 54 with each track comprising transducers 52A, 52B, 54, 56 and two gratings 58, 60 cascading acoustically along a longitudinal axis 62. A signal input 64 is applied on the center transducer 52A and the signal output 66 is taken from the lateral center transducer 52B. This filter 50 has an input impedance and an output impedance in the same range (typically 50 ohms) and illustrates a single input and a single output styled filter, by way of example.

Figure 4:
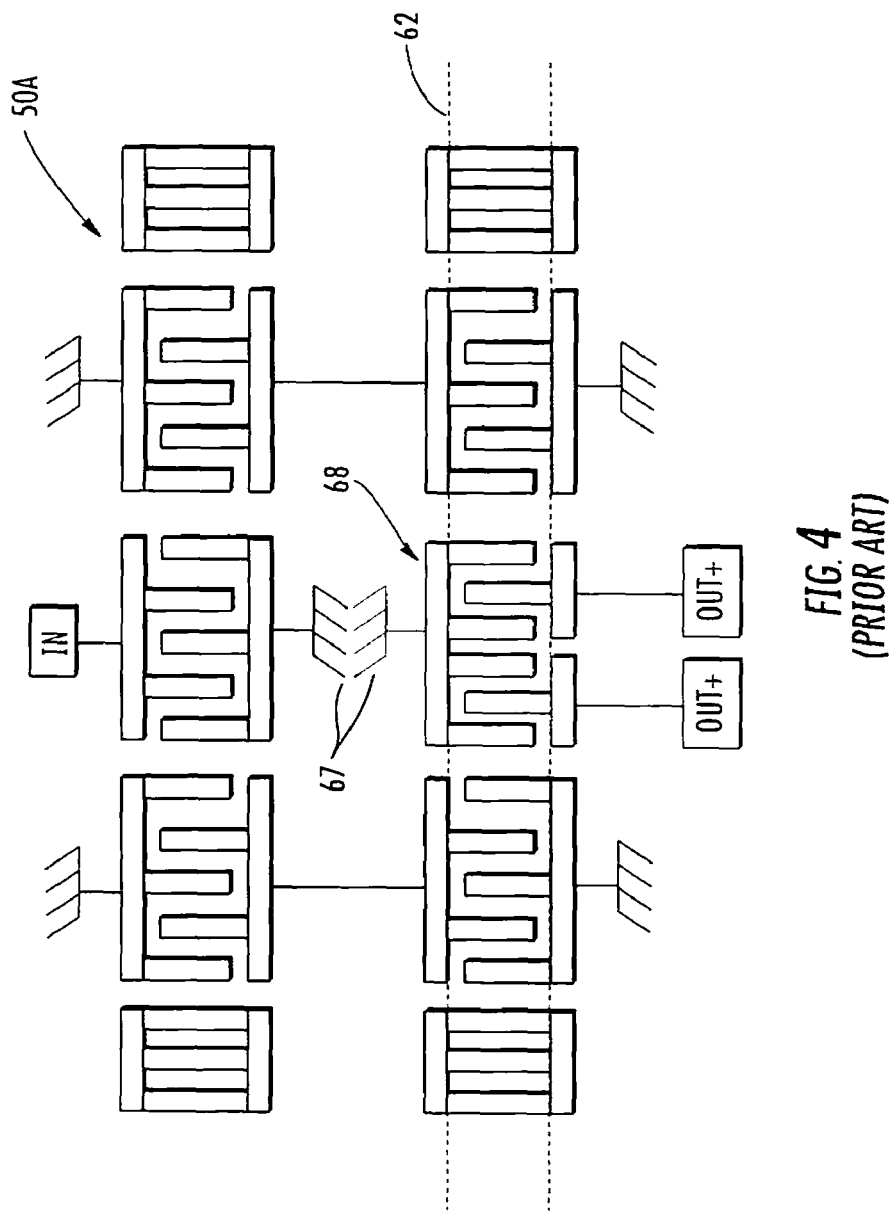
FIG. 4 is a diagrammatical plan view illustration of one known balanced coupled resonator filter (CRF) having a two tracks including a split transducer.

To obtain a balanced output, one method includes splitting a center transducer 68 of the output track 62 into two parts connected in series and having a 180 degrees phase difference as illustrated with reference to FIG. 4 for filter 50A. The input impedance remains unchanged while the output impedance is about 4 times larger than the one obtain with the previous structure. Typically, filters made using the split transducer structure of FIG. 4 have a 50 ohm input impedance and 200 ohms output impedance.

Figure 5:
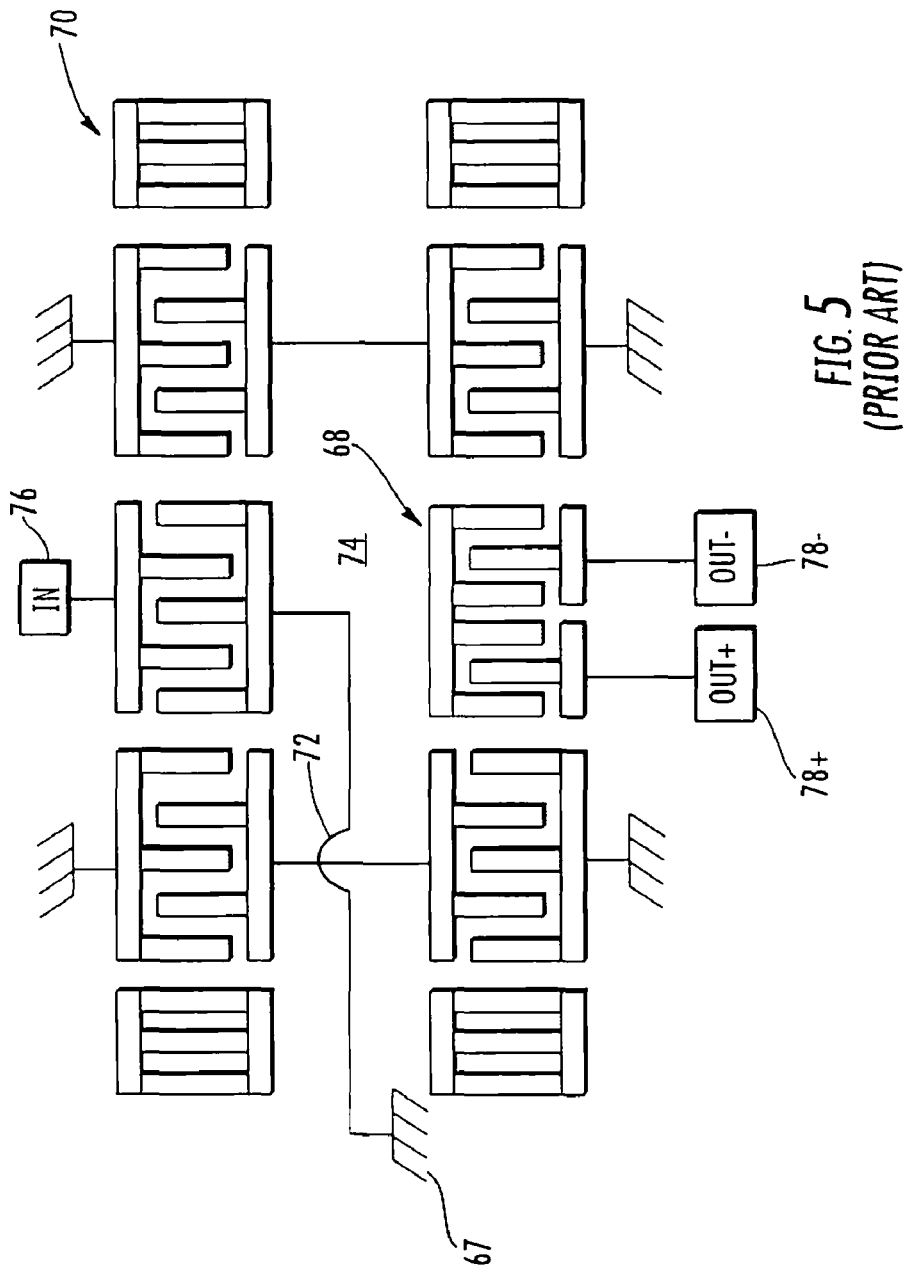
FIG. 5 is a diagrammatical plan view illustration of one known balanced coupled resonator filter (CRF) with crossovers having a two tracks including a split transducer.

Practically, another important point when discussing CRF structures is the typical way a connection is made. By way of example for the filters 40, 50, 50A illustrated with reference to FIGS. 2-4, one or two ground connections 67 are needed in a center of the device. This is costly in terms of substrate space and it is common to use an alternative approach as illustrated with reference to a filter 70 as illustrated by way of further example with reference to FIG. 5, wherein a cross-over bridge 72 is provided on a supporting die surface 74 to pass the connection. Such crossover bridges normally use a dielectric layer to electrically separate traces. The known coupled resonator filter 70 includes a single ended input 76 and a balanced signal output 78+, 78− along with the crossover bridge 72 located between the transducer having the input 76 and ground 67.

Figure 6:
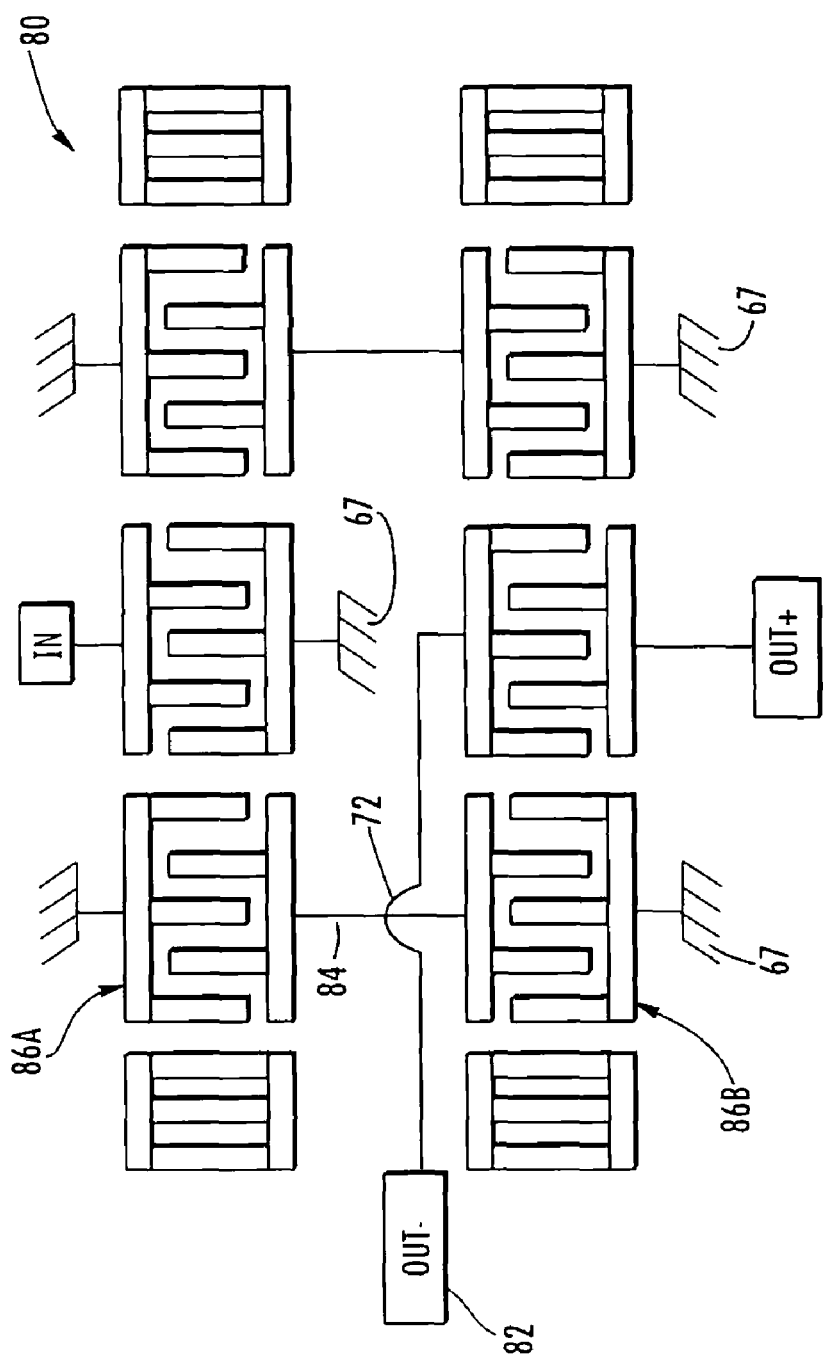
FIG. 6 is a diagrammatical plan view illustration of a balanced 50 ohm coupled resonator filter (CRF) having a two tracks.

In spite of known filter development to date, there is a need for lower impedance than the typical 200 ohms for the balanced side outputs 78+, 78−. By way of example, 100 ohms impedance is desirable for optimal impedance matching with an amplifier. This is generally difficult to obtain with the filters illustrated with reference to FIGS. 4 and 5. As is appreciated by those skilled in the art, it is a complex matter when designing to reduce the impedance from the 200 ohms natural impedance for such a structure to 100 ohms. One approach herein taken for embodiments of the preset invention is to choose the SAW filter structure for a low natural impedance of 50 ohms and to modify the design for obtaining 100 ohms. Embodiments of the invention may then be constructed by starting from a filter structure illustrated earlier with reference to FIG. 3 and have one side balanced by connecting two bus bars of one of the center transducers to the balanced outputs (or inputs), as herein illustrated by way of example with reference to the filter 80 of FIG. 6. However, one problem results with crosstalk due to the crossover bridge capacitance between the output (out−) 82 and the left lateral transducers connection 84 between transducers 86A, 86B. This crosstalk results in filter rejection degradation and in degradation of the symmetry. As a result, there remains a need to provide a filter with good rejection and symmetry while allowing lower output impedance. The filter 10 illustrated above with reference to FIG. 1, by way of example, satisfies such a need.

Figure 7:
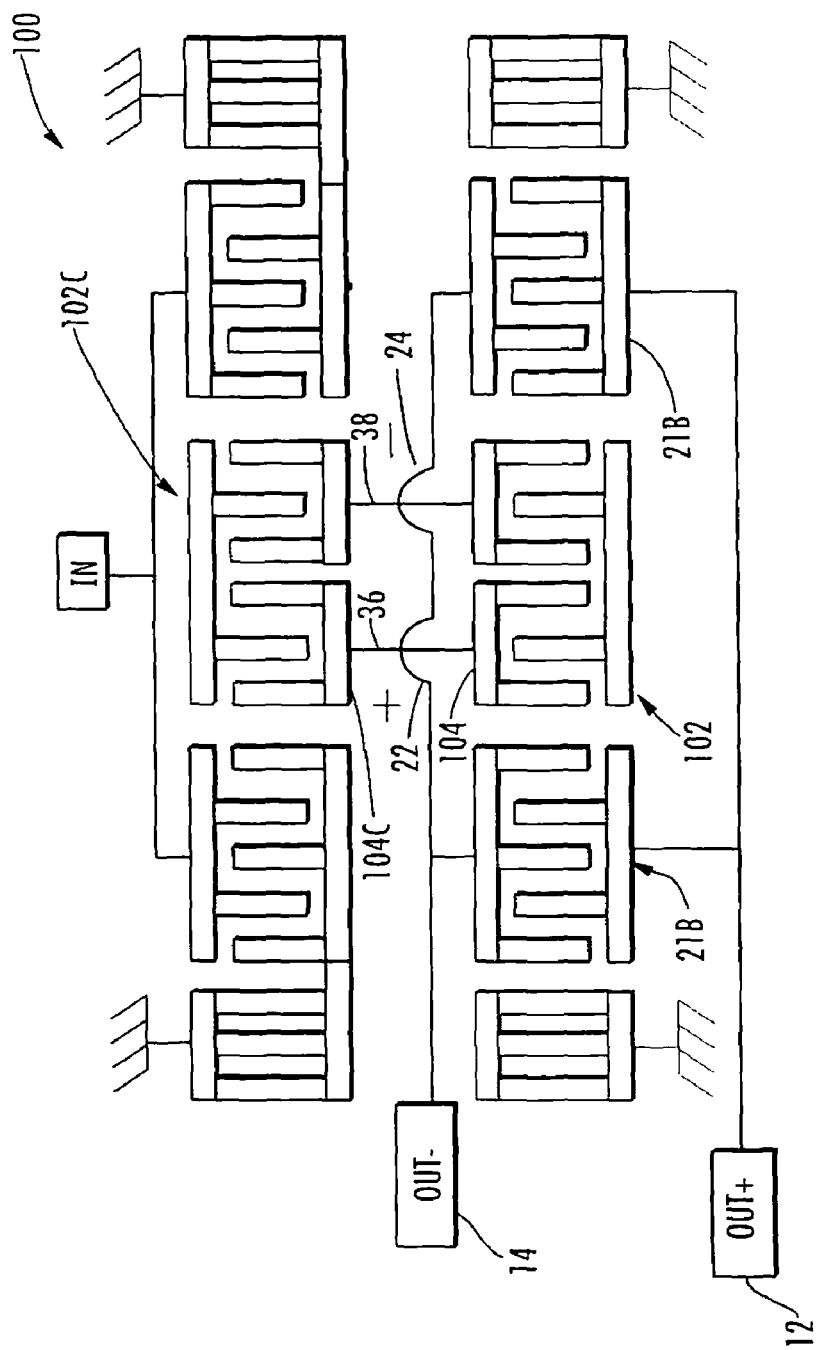
FIG. 7 is a diagrammatical illustration of a second embodiment of a coupled resonator filter (CRF) in keeping with the teachings of the present invention.

Yet further, and in keeping with the teachings of the present invention, reference is now made to the filter 100 of FIG. 7 illustrating an alternate embodiment of the invention. As earlier presented with reference to FIG. 1 and as illustrated with reference to FIG. 7, to obtain a cancellation of the coupling in the crossover bridge 22, the second crossover bridge 24 is added and extends over the second connecting line 38. The second crossover bridge 24 is used to obtain a desirable capacitance. With two equal capacitances between the output (out−) 14 and the two connection lines 36 (+) and 38 (−), the effect of the two capacitances on the filter response cancels each other. As herein illustrated, center transducers 102, 102C are split styled transducers as earlier described with reference to FIG. 5. The connecting lines 36, 38 are connected between the split bus bars 104, 104C of each transducer. As illustrated, the outputs 12, 14 are taken from the external transducers 21B.

Figure 8:
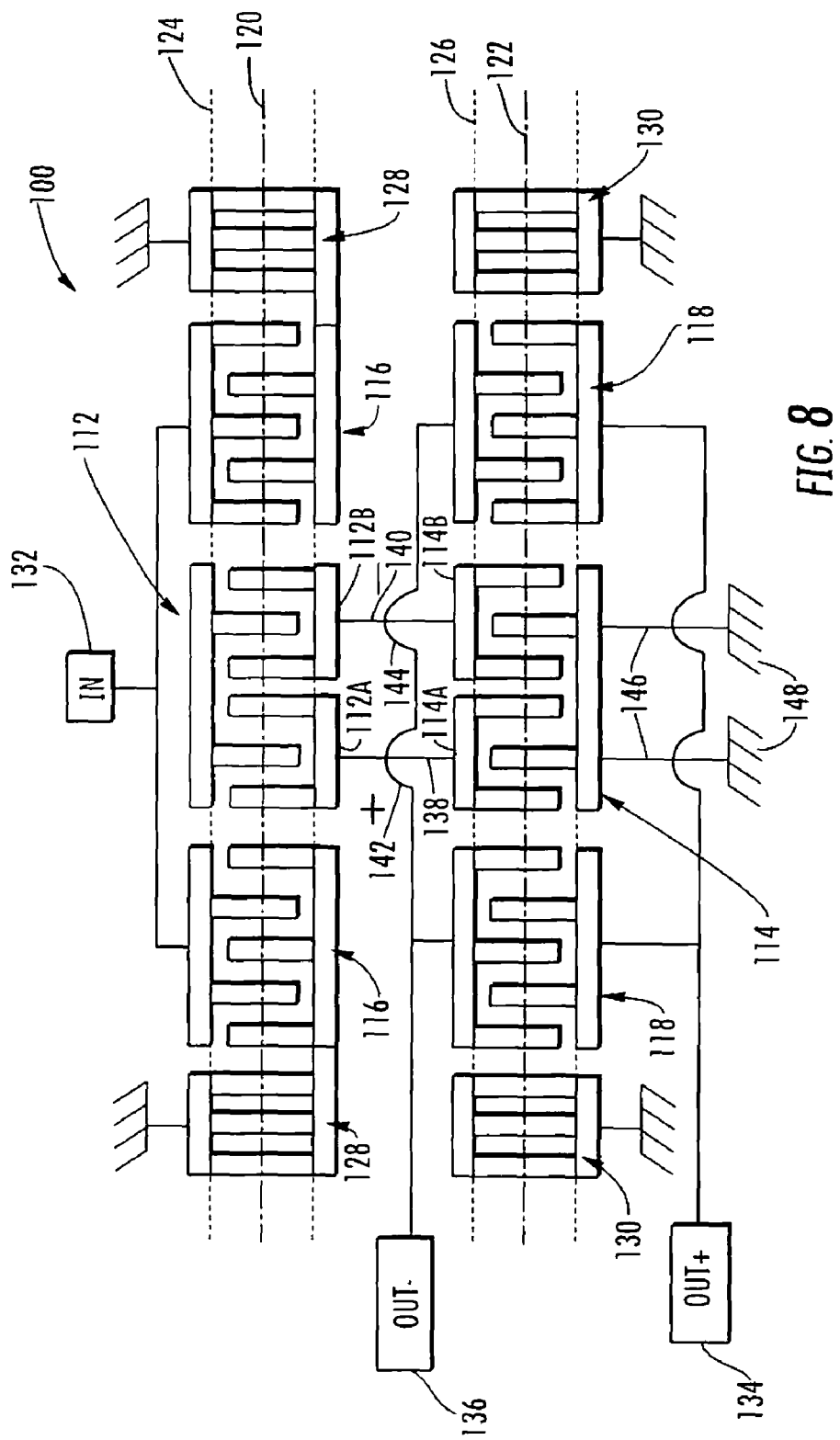
FIG. 8 is a diagrammatical illustration of a third embodiment of a coupled resonator filter (CRF) in keeping with the teachings of the present invention.

Another embodiment of the invention is herein illustrated by way of example with reference to FIG. 8, wherein a SAW filter 110 comprises center transducers 112, 114 and external transducers 116, 118 that are acoustically cascaded along respective longitudinal axes 120, 122 of a filter tracks 124, 126. The filter tracks 124, 126 each includes two reflective gratings 128, 130 attached at each end. Instead of coupling the two tracks 124, 126 using the lateral external transducers 21A, 21B as earlier presented with reference to FIG. 1, the coupling is done using the center transducers 112, 114 and the signal input 132 and outputs 134, 136 are connected to the lateral external transducers 116, 118, respectively, as illustrated with continued reference to FIG. 8. The center transducers 112, 114 have the split transducer structure as earlier described and include into two halves 112A, 112B, 114A, 114B in opposite phases and connected in series. The two voltages on the coupling lines 138, 140 between the two tracks 124, 126 have opposite polarity, so that the effect of the two capacitances in the crossover bridges 142, 144 cancels each other. To further improve filter symmetry, one may add crossover bridges 146 with the ground 148 on the connection to the output (out+) 134.

As illustrated with continued reference to FIG. 8, the coupled resonator filter 110 is presented, by way of example, as having a minimum of two cascaded tracks 124, 126 and three transducers per track where the output 134, 136 or the input 132 is taken on the two opposite bus bars of one or several transducers so that crossover technology may be used to connect the output or input transducers and for which the number lines crossed for each output bus bar includes an even number of lines. The filter 110 is constructed such that to each crossed line there is a corresponding line with opposite voltage to cancel the effect of the cross over capacitance.

Figure 9:
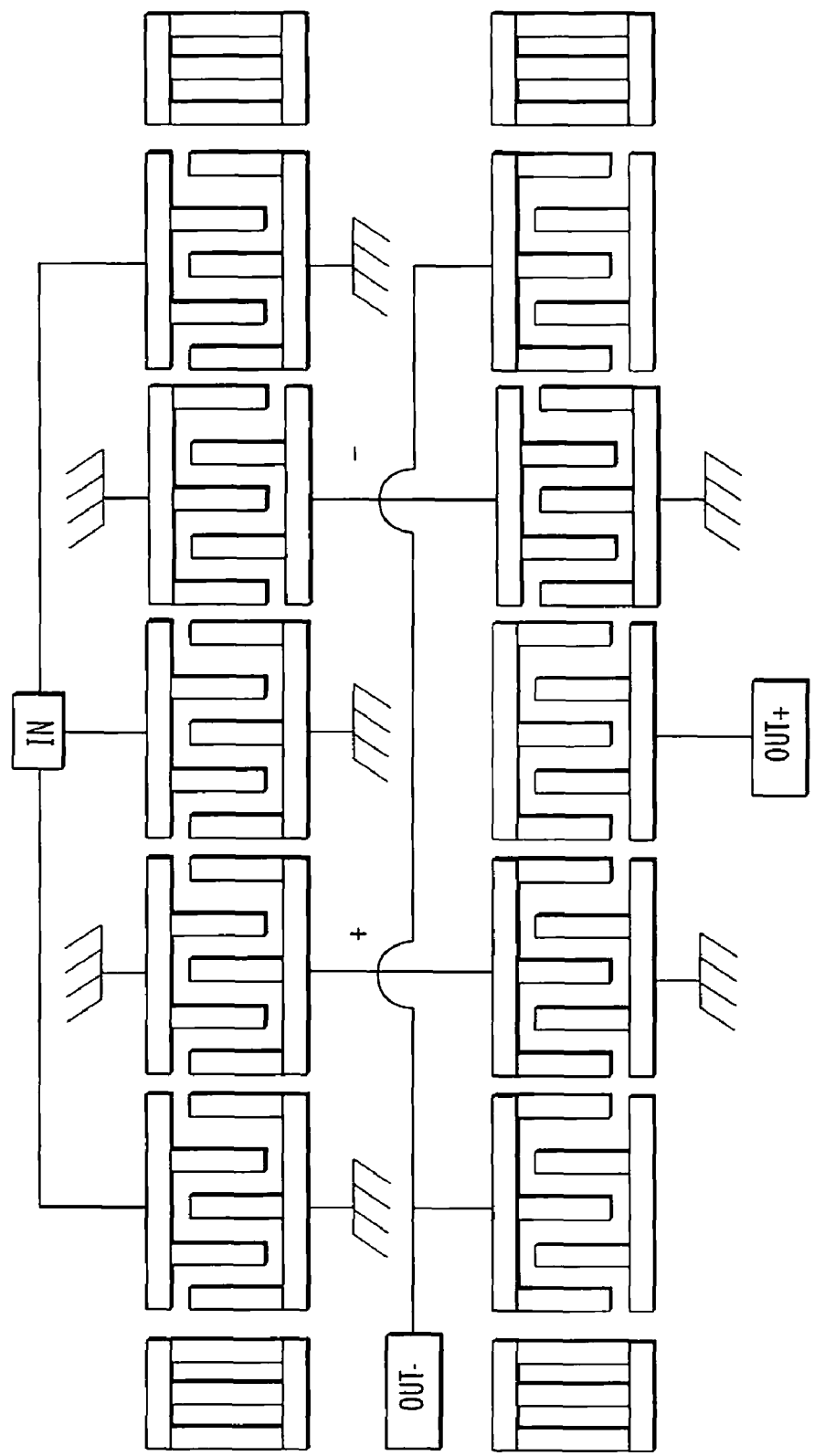
FIG. 9 is a diagrammatical illustration of a fourth embodiment of a coupled resonator filter (CRF) in keeping with the teachings of the present invention.
Figure 10:
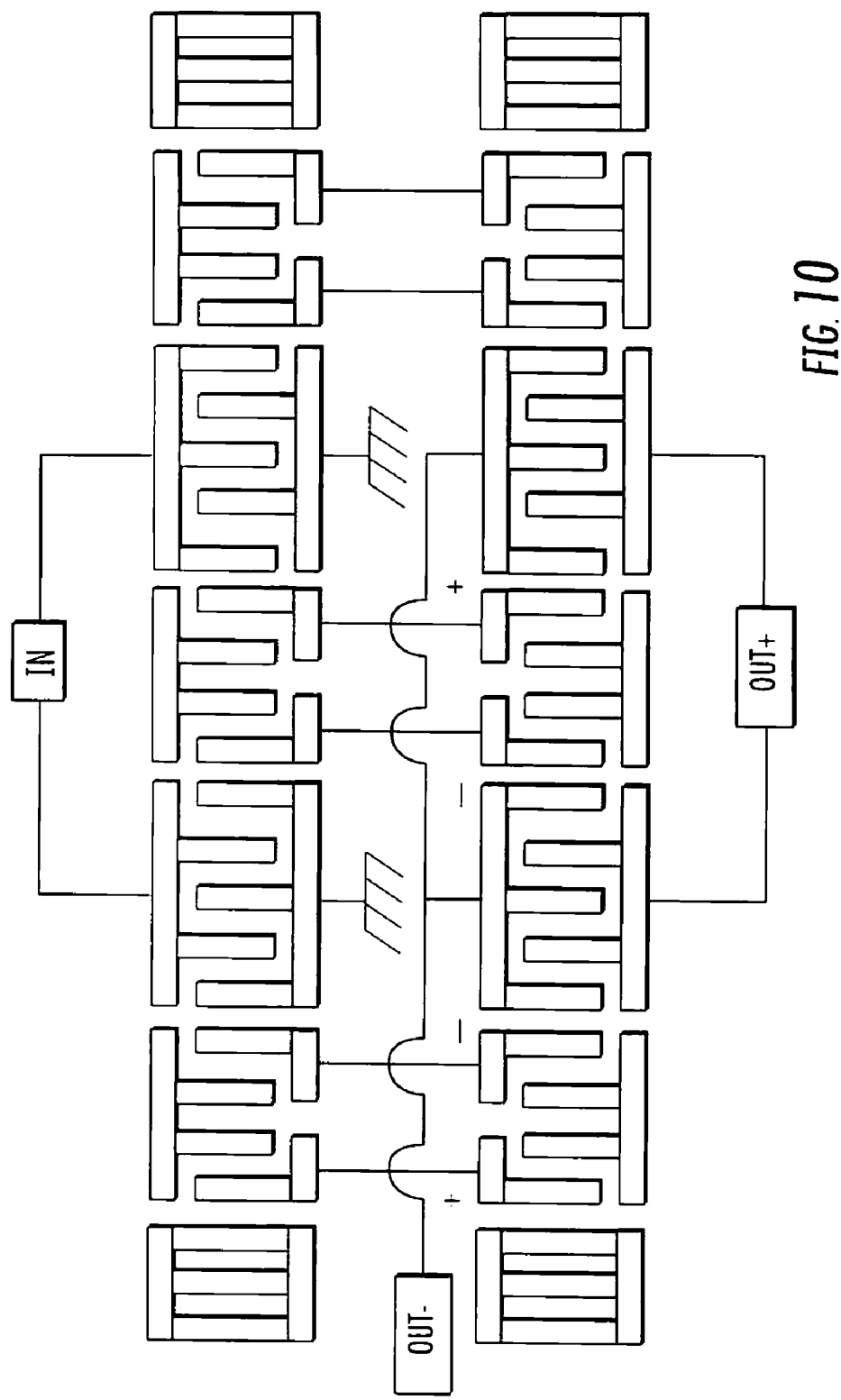
FIGS. 10 and 11 are diagrammatical illustrations of a fifth and sixth embodiments of a coupled resonator filter (CRF) in keeping with the teachings of the present invention.
Figure 11:
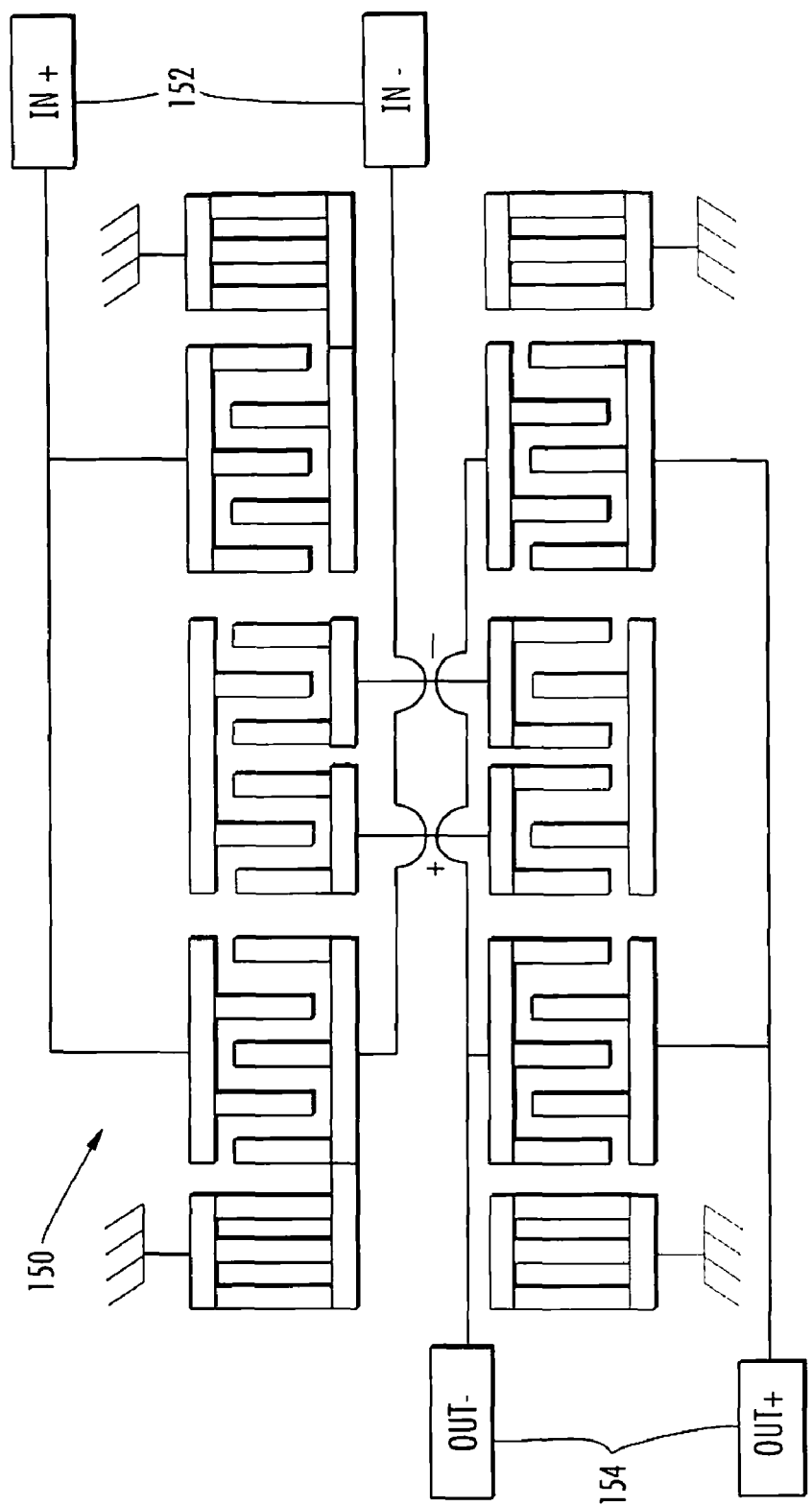

Within the teachings of the present invention, alternate embodiments may include filters having more than three transducers in the output track, by way of example. More than three transducers per track may be used to improve the filter transfer function. By way of example with reference to FIGS. 9-11, such filters having multiple transducers per track may be constructed. Other possibilities to achieve the same result will come to the mind of one skilled in the art now having the benefit of the teaching of the present invention. Yet further, a filter 150 having a balanced input 152 and a balanced output 154, is illustrated with reference to FIG. 11 as an example of one such filter having three transducers per track. Alternate embodiments may include five transducers per track or more as desired.

Figure 12:
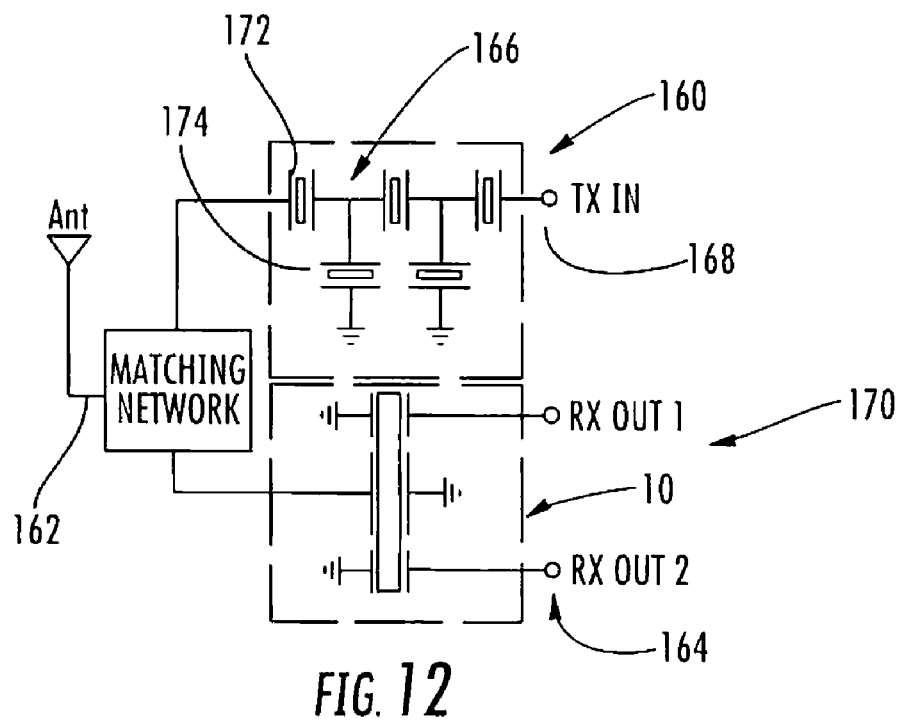
FIG. 12 is a diagrammatical illustration of a SAW duplexer in keeping with the teachings of the present invention.
Figure 13:
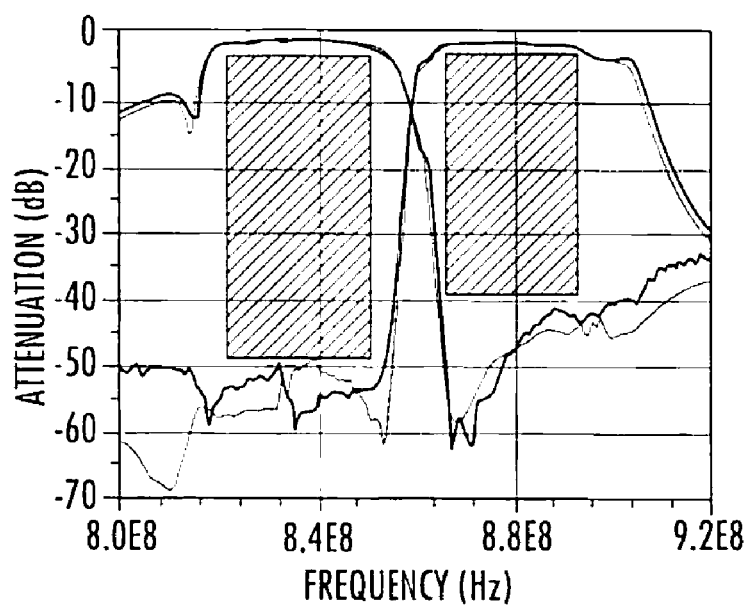
FIG. 13 illustrates duplexer performance characteristics of a code division multiple access (CDMA) network including SAW devices of the present invention, by way of example.

Coupled resonator filters (CRF) cascaded with resonator elements may include the resonator in series or in parallel and cascaded with the CRF to improve rejection. Resonators can be added at the input, at the output, or between two tracks. By way of continued example, the CRF 10, or alternate embodiments as herein described, may be used as part of a duplexer 160, as illustrated with reference to FIG. 12. Typically, such duplexers 160 have an antenna port 162 having 50 ohm impedance while the Tx and Rx ports 164 may have a different impedance. New generations of low noise amplifiers LNA require a balanced input, and 100 ohms is often required for impedance. To provide such a duplexer 160, as illustrated herein by way of example, a ladder filter 166 which can handle relatively higher power may be used for the Tx side 168 while the CRF 10 as above described for embodiments of the invention may be used at the Rx side 170. The CFR 10 may be driven in a single ended or differential mode. The ladder filter 166 includes at least one SAW resonator 172 in a series leg and at least one SAW resonator 174 in a parallel leg thereof. FIG. 13 illustrates a performance of one example of such a duplexer. By way of further example, one Rx part is made of a three transducer CRF as described earlier with reference to FIG. 8.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A surface acoustic wave coupled resonator filter comprising:
    a piezoelectric substrate suitable for propagation of surface acoustic waves;
    opposing filter tracks, each track having a plurality of acoustically cascaded transducers disposed upon the piezoelectric substrate along a longitudinal axis of the filter track, wherein the plurality of acoustically cascaded transducers includes a center transducer and external transducers on opposing sides thereof, and wherein the center transducer comprises a split transducer;
    each of the filter tracks having a plurality of signal pads associated with the transducers and at least one of the filter track signal pads is driven in at least one of a differential mode and a balanced mode, wherein the opposing filter tracks are electrically connected by at least two connecting lines connected between the opposing split transducers; and
    at least two crossover bridges, each crossover bridge crossing one of the at least two connecting lines, wherein voltages for the at least two crossover bridges are approximately the same, and wherein voltages for the at least two connecting lines are approximately the same in magnitude but are substantially out-of-phase.

2. The filter according to claim 1, wherein the external transducers are adjacent the center transducer.

3. The filter according to claim 1, wherein the split transducers each comprise a split bus bar, and wherein the split bus bar of the split transducer in one filter track is in an opposing position to the split bus bar of the split transducer in the opposing filter track.

4. The filter according to claim 1, wherein the plurality of transducers comprises three transducers.

5. The filter according to claim 1, further comprising reflector gratings carried within each filter track along the longitudinal axis and external the transducers.

6. The filter according to claim 1, wherein a signal input is obtained at the external transducers along a first filter track and driven in a single ended mode, and wherein a signal output is obtained at the external transducers of a second filter track and driven in the at least one of the differential mode and the balanced mode.

7. The filter according to claim 6, wherein at least one of the signal input and the signal output is provided by an electrical connection including the crossover bridges.

8. The filter according to claim 1, wherein at least one of an input signal and an output signal is provided by at least one of the signal pads through an electrical connection including the at least two crossover bridges.

9. The filter according to claim 1, wherein each of the split transducers comprises at least one split bus bar, and wherein the connecting lines transversely connect the at least one split bus bar of opposing transverse filter tracks.

10. The filter according to claim 9, wherein the bus bars of opposing external transducers provide signal pads for the signal input and the signal output.

11. The filter according to claim 1, wherein signal pads from the external transducers within one filter track provide an input signal and signal pads from the external transducers within the opposing filter track provide an output signal.

12. The filter according to claim 1, wherein at least one of the plurality of acoustically cascaded transducers comprises an unapodized transducer.

13. A surface acoustic wave filter comprising:
    a piezoelectric substrate;
    at least two filter tracks, each track having a plurality of acoustically cascaded transducers disposed upon the piezoelectric substrate along a longitudinal axis thereof, wherein at least one transducer within each filter track comprises a split transducer, and wherein at least one of the filter tracks is driven in at least one of a differential mode and a balanced mode;
    a plurality of connecting lines electrically connecting the at least two filter tracks by an electrical connection between the split transducers; and
    a plurality of crossover bridges crossing over at least two of the plurality of connecting lines, wherein voltages for the plurality of crossover bridges are approximately the same, and wherein voltages for each pair of connecting lines of the plurality of connecting lines between corresponding split transducers are approximately the same in magnitude but are substantially out-of-phase.

14. The filter according to claim 13, wherein the plurality of acoustically cascaded transducers includes a center transducer and an external transducer on opposing sides thereof, and wherein the center transducer comprises the split transducer.

15. The filter according to claim 14, wherein the external transducers are adjacent the center transducer.

16. The filter according to claim 13, wherein the split transducers each comprise a split bus bar, and wherein the split bus bar of the split transducer in one filter track is in an opposing position to the split bus bar of the split transducer in the opposing filter track.

17. The filter according to claim 13, wherein the plurality of transducers comprises three transducers.

18. The filter according to claim 13, further comprising reflector gratings carried external to the transducers along the longitudinal axis.

19. The filter according to claim 18, wherein a signal input is obtained at the external transducer along a first filter track and driven in a single ended mode, and wherein a signal output is obtained at the external transducer of a second filter track and driven in the at least one of the differential mode and the balanced mode.

20. The filter according to claim 13, wherein at least one of an input signal and an output signal is provided by an electrical connection including the plurality of crossover bridges.

* * * * *